(12) United States Patent
Brule et al.

(10) Patent No.: US 10,788,851 B2
(45) Date of Patent: Sep. 29, 2020

(54) SELF-BIASED TEMPERATURE-COMPENSATED ZENER REFERENCE

(71) Applicant: NXP USA, Inc., Austin, TX (US)

(72) Inventors: Simon Brule, Toulouse (FR); Yuan Gao, Cugnaux (FR); Olivier Tico, St Lys (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/394,634

(22) Filed: Apr. 25, 2019

(65) Prior Publication Data

US 2020/0218302 A1 Jul. 9, 2020

(30) Foreign Application Priority Data

Jan. 9, 2019 (EP) .................................... 19305028

(51) Int. Cl.
*G05F 3/18* (2006.01)
*H01L 29/866* (2006.01)
*G01R 19/32* (2006.01)

(52) U.S. Cl.
CPC ............. *G05F 3/185* (2013.01); *G01R 19/32* (2013.01); *H01L 29/866* (2013.01)

(58) Field of Classification Search
None
See application file for complete search history.

(56) References Cited

U.S. PATENT DOCUMENTS

| 4,283,674 A | 8/1981 | Kominami et al. |
| 4,315,209 A | 2/1982 | Schmook |
| 4,352,056 A | 9/1982 | Cave et al. |
| 5,446,349 A | 8/1995 | Bocan et al. |
| 5,568,368 A | 10/1996 | Steigerwald et al. |
| 6,271,605 B1 | 8/2001 | Carkner et al. |
| 7,246,416 B2 | 7/2007 | Duffy |

(Continued)

FOREIGN PATENT DOCUMENTS

| GB | 1401745 | 12/1975 |
| JP | H05100757 A | 4/1993 |
| WO | 93/04423 A1 | 3/1993 |

OTHER PUBLICATIONS

Final Office Action for U.S. Appl. No. 16/286,758 dated Dec. 5, 2019, 18 pages.

(Continued)

*Primary Examiner* — Lincoln D Donovan
*Assistant Examiner* — Khareem E Almo

(57) ABSTRACT

An apparatus, a method, and an integrated circuit for a providing a temperature-compensated Zener reference are disclosed. In accordance with at least one embodiment, the apparatus comprises a proportional-to-absolute-temperature (PTAT) current source; a complementary-to-absolute-temperature (CTAT) current source; and a Zener diode, with the PTAT current source coupled to a first Zener diode terminal of the Zener diode, the CTAT current source coupled to the first Zener diode terminal of the Zener diode, and the PTAT current source providing a PTAT current and the CTAT current source providing a CTAT current, wherein the PTAT current and the CTAT current are combined for provide a temperature-compensated bias current.

19 Claims, 3 Drawing Sheets

(56) References Cited

U.S. PATENT DOCUMENTS

| | | | |
|---|---|---|---|
| 7,423,416 B1 | 9/2008 | Quinones et al. | |
| 7,426,416 B2 | 9/2008 | Sri-Jayantha et al. | |
| 9,448,579 B2 | 9/2016 | Marinca | |
| 10,281,946 B1* | 5/2019 | Baranwal | G05F 3/267 |
| 2004/0004992 A1 | 1/2004 | Aota et al. | |
| 2007/0252573 A1* | 11/2007 | Tachibana | G05F 3/30 |
| | | | 323/313 |
| 2009/0059623 A1 | 3/2009 | Cai | |
| 2011/0074495 A1 | 3/2011 | Duval et al. | |
| 2015/0102856 A1* | 4/2015 | Barrett, Jr. | G05F 3/30 |
| | | | 327/539 |
| 2015/0177771 A1 | 6/2015 | Marinca | |
| 2019/0317542 A1* | 10/2019 | Brule | G05F 3/30 |

OTHER PUBLICATIONS

EP Application 19306379.9, filed Oct. 24, 2019, 21 pages.
Non-Final Office Action for U.S. Appl. No. 16/286,758 dated Jul. 10, 2019, 14 pages.
Pryce, Dave, "EDN Special Report—Voltage References," No. 2, Jan. 13, 1990, pp. 120-126, and 128.
Non-Final Office Action for U.S. Appl. No. 16/286,758 dated Oct. 18, 2019, 10 pages.
U.S. Appl. No. 16/286,758, filed Feb. 27, 2019.
Hood, John L. Linsley, "LM109 three-terminal voltage regulator," Wireless World, vol. 88, No. 1554, Mar. 1, 1982, pp. 41-44.
Ex parte Quayle Office Action for U.S. Appl. No. 16/286,758 dated Feb. 6, 2020, 13 pages.
Non-Final Office Action for U.S. Appl. No. 16/286,758 dated Jun. 11, 2020, 8 pages.

* cited by examiner

US 10,788,851 B2

SELF-BIASED TEMPERATURE-COMPENSATED ZENER REFERENCE

BACKGROUND

Field of the Disclosure

The present disclosure relates generally to reference circuits and more particularly to temperature-compensated reference circuits.

Background of the Disclosure

Precision references provide a precise analog value, such as a voltage or a current, which can be used by circuits to operate in their intended manners. Zener reference circuits are preferred in highly accurate measurements chains where very low long-term drift is of great importance. They are indeed less sensitive to package stresses and more stable over their lifetimes than the classical bandgap circuits.

As was previously done for a battery management system integrated circuit (BMS IC), a Zener reference was biased using an existing reference current generated in a bandgap circuit trimmed over temperature range. This trimming sequence was performed on automated test equipment (ATE) on all the packaged parts at several temperatures, for example, −40° C. and 125° C., and optionally 25° C.

Since temperature coefficient trimming of Zener reference bias current was finalized after having measured performance at two boundary temperatures, the Zener reference voltage at both boundary temperatures was not known during first ATE temperature test. Because measurement chain accuracy relies on the reference voltage, which needed to be known during the first ATE temperature test, the Zener reference voltage was measured for all trimming codes, so that a corresponding look-up table (LUT) was created, allowing retrieval of final reference voltages at first temperature insertion once the IC was tested at its second test temperature.

This LUT creation required a long test time to measure reference voltage for all trim codes. It added cost and also a measurement error that degraded the measurement chain accuracy. Accordingly, an improved temperature compensated Zener reference is needed.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

An auto-biased solution for a Zener reference is described. The auto-biasing removes dependencies on the performance or trimming of other blocks. The auto-biasing reduces test time and cost and improves the calibration accuracy. The self-bias current is constant over the temperature range to minimize voltage reference temperature non-linearities.

Figure 1:
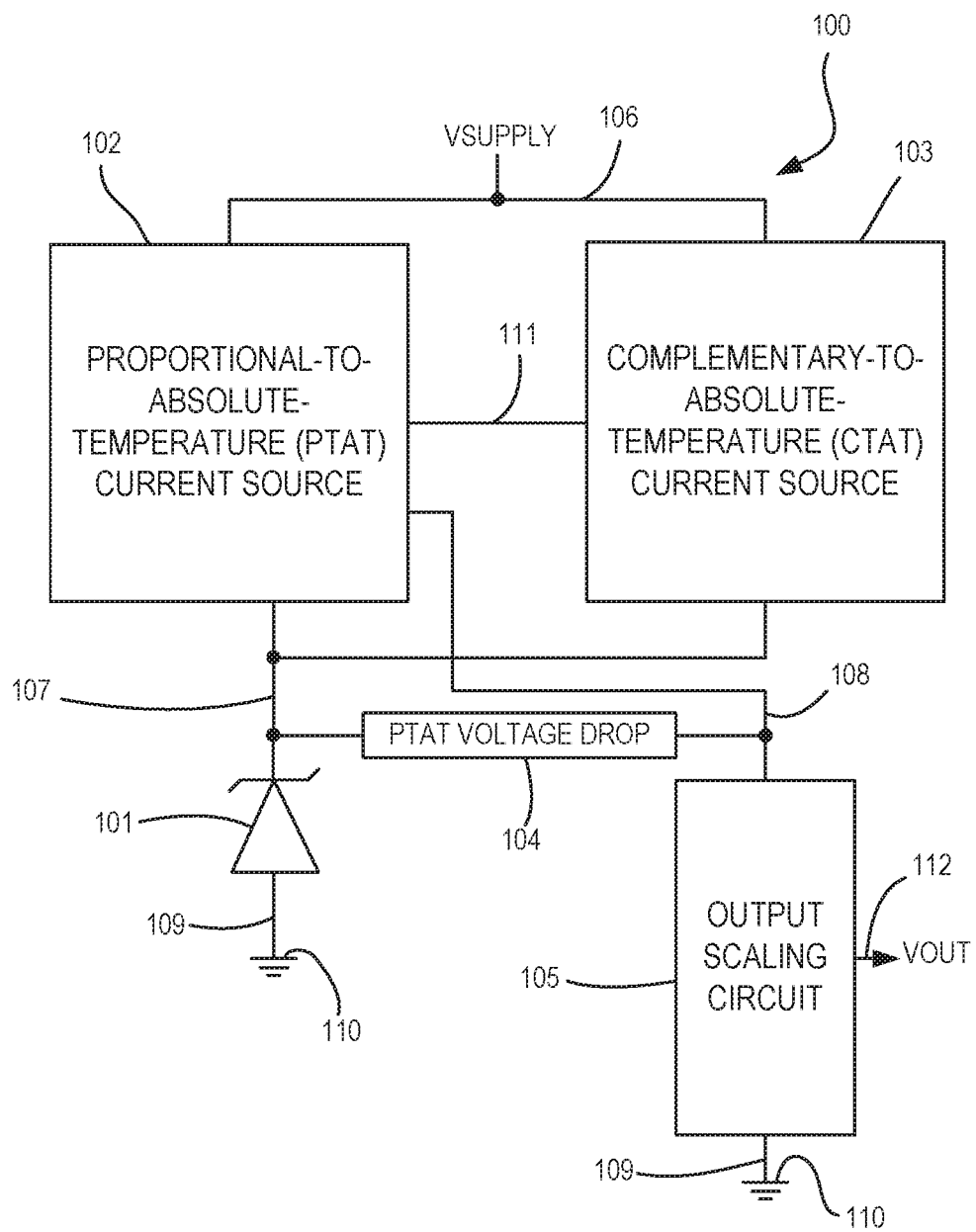
FIG. 1 is a block diagram illustrating a self-biased temperature-compensated Zener-diode voltage reference circuit in accordance with at least one embodiment.

FIG. 1 is a block diagram illustrating a self-biased temperature-compensated Zener-diode voltage reference circuit in accordance with at least one embodiment. Circuit 100 comprises Zener diode 101, proportional-to-absolute-temperature (PTAT) current source 102, complementary-to-absolute-temperature (CTAT) current source 103, PTAT voltage drop 104, and output scaling circuit 105. A supply voltage source is coupled to node 106, which is connected to a supply voltage input of PTAT current source 102 and to a supply voltage input of CTAT current source 103. A cathode of Zener diode 101 is connected to node 107, which is connected to a PTAT current output of PTAT current source 102, to a CTAT current output of CTAT current source 103, and to an input of PTAT voltage drop 104. An anode of Zener diode 101 is connected to ground voltage 110 at node 109. An output of PTAT voltage drop 104 at node 108 is connected to a temperature-stabilized supply voltage input of PTAT current source 102 and to an input of output scaling circuit 105. Output scaling circuit 105 provides an output reference voltage VOUT at voltage reference output 112. Output scaling circuit 105 is connected to ground voltage 110 at node 109. PTAT current source 102 is connected to node 111, which is connected to a CTAT control input of CTAT current source 103.

Supply voltage VSUPPLY is provided at node 106 to PTAT current source 102 and to CTAT current source 103. PTAT current source 102 provides a PTAT current to node 107. CTAT current source 103 provides a CTAT current to node 107. A portion of the sum of the PTAT current and the CTAT current is obtained from node 107 and provided to PTAT voltage drop 104 as a Zener diode voltage output current. PTAT voltage drop 104 provides substantially all of the Zener diode voltage output current to output scaling circuit 105 and to PTAT current source 102. Zener diode 101 passes a Zener diode current equal to the sum of the PTAT current and the CTAT current minus the Zener diode voltage output current. Output scaling circuit 105 provides an output reference voltage VOUT at output node 112. PTAT voltage drop 104 provides a temperature-stabilized supply voltage signal to a temperature-stabilized supply voltage input of PTAT current source 102 via node 108. PTAT current source 102 provides a CTAT control signal to CTAT current source 103 via node 111.

By utilizing a combined current obtained from PTAT current source 102 and CTAT current source 103, the proportional thermal response of PTAT current source 102 and the complementary thermal response of CTAT current source 103 balance each other out to provide a temperature-compensated bias current to supply to Zener diode 101. To compensate for Zener voltage variation of Zener diode 101 with temperature, PTAT voltage drop 104 provides a voltage reduction proportional to current flow through it. Accordingly, a dropped voltage at the output of PTAT voltage drop 104 is temperature compensated, thereby providing a temperature-stabilized voltage signal, whereas the Zener diode voltage at the input of PTAT voltage drop 104 exhibits a temperature dependence as a characteristic of Zener diode 101. Output scaling circuit 105 allows the temperature-stabilized voltage signal at the output of PTAT voltage drop 104 to be adjusted to provide an output reference voltage of a desired voltage. Thus, the desired voltage can be stably provided as the output reference voltage regardless of temperature.

Figure 2:
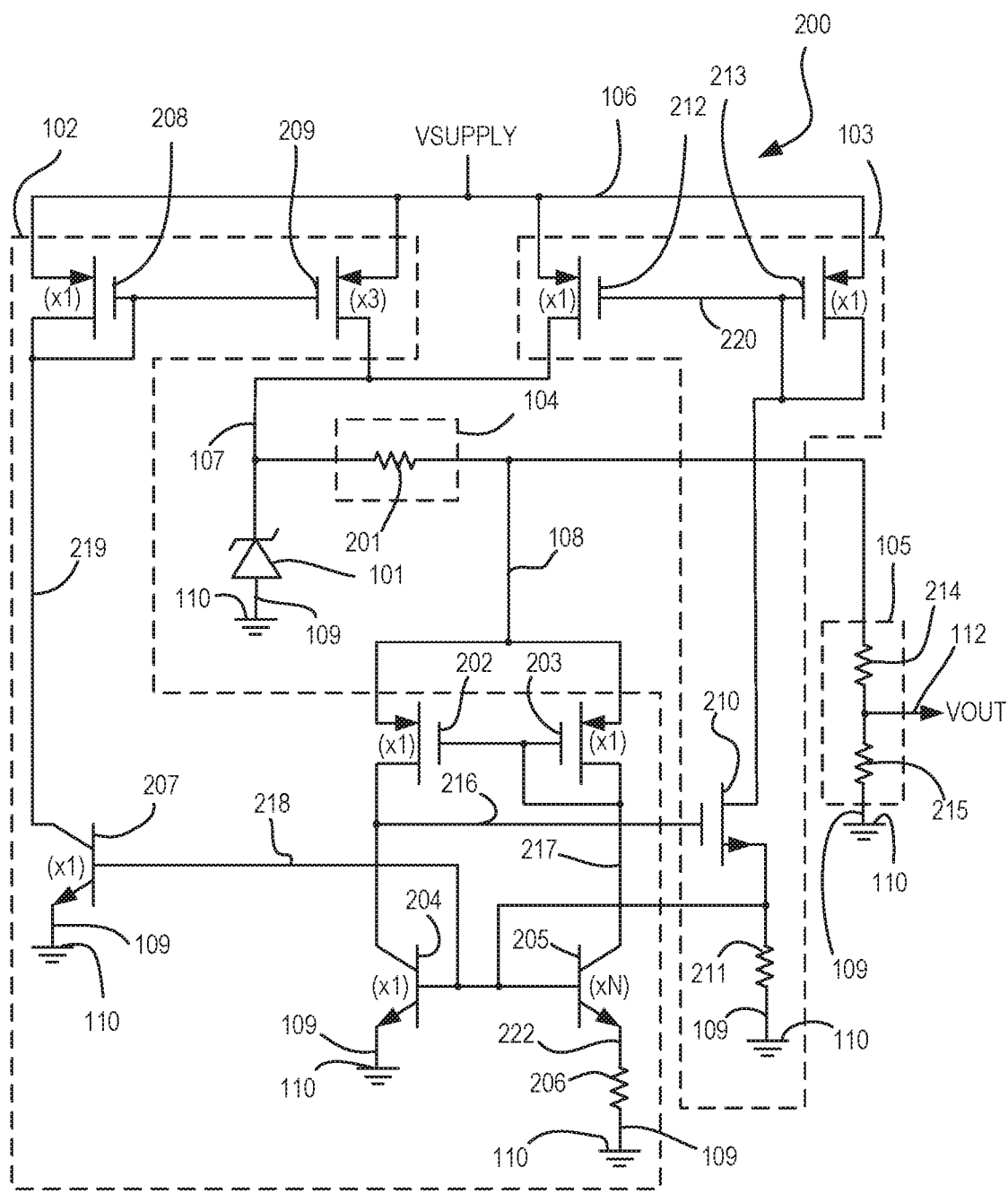
FIG. 2 is a schematic diagram illustrating a self-biased temperature-compensated Zener-diode voltage reference circuit in accordance with at least one embodiment.

FIG. 2 is a schematic diagram illustrating a self-biased temperature-compensated Zener-diode voltage reference circuit in accordance with at least one embodiment. Circuit 200 comprises Zener diode 101, PTAT current source 102, CTAT current source 103, PTAT voltage drop 104, and output scaling circuit 105. PTAT current source 102 comprises p-channel MOSFET 202, p-channel MOSFET 203, NPN bipolar transistor 204, NPN bipolar transistor 205, resistor 206, NPN bipolar transistor 207, p-channel MOSFET 208, and p-channel MOSFET 209. A PTAT current source core of the PTAT current source 102 comprises p-channel MOSFET 202, p-channel MOSFET 203, NPN bipolar transistor 204, NPN bipolar transistor 205, and resistor 206. CTAT current source 103 comprises n-channel MOSFET 210, resistor 211, p-channel MOSFET 212, and p-channel MOSFET 213. PTAT voltage drop 104 comprises resistor 201. Output scaling circuit 105 comprises resistor 214 and resistor 215.

Supply voltage VSUPPLY is connected to node 106, which is connected to a source terminal of p-channel MOSFET 208, to a source terminal of p-channel MOSFET 209, to a source terminal of p-channel MOSFET 212, and to a source terminal of p-channel MOSFET 213. A gate terminal of p-channel MOSFET 208 is connected to a gate terminal of p-channel MOSFET 209 and to a drain terminal of p-channel MOSFET 208, forming a MOSFET current mirror for PTAT current source 102. A gate terminal of p-channel MOSFET 212 is connected to a gate terminal of p-channel MOSFET 213 and to a drain terminal of p-channel MOSFET 213 at node 220, forming a MOSFET current mirror for CTAT current source 103. A drain terminal of p-channel MOSFET 209 is connected to a cathode of Zener diode 101 at node 107. A drain terminal of p-channel MOSFET 212 is connected to the cathode of Zener diode 101 at node 107. The anode of Zener diode 101 is connected to ground voltage 110 at node 109. The cathode of Zener diode 101 is connected at node 107 to a first terminal of resistor 201 of voltage drop 104. A second terminal of resistor 201 of voltage drop 104 is connected to node 108. Node 108 is connected to a source terminal of p-channel MOSFET 202, to a source terminal of p-channel MOSFET 203, and to a first terminal of resistor 214. Resistor 214 is the upper resistor of a voltage divider formed of resistor 214 and resistor 215 connected in series. The second terminal of resistor 214 is connected to reference voltage output 112 and to a first terminal of resistor 215. The second terminal of resistor 215 is connected to ground voltage 110 via node 109. The voltage divider formed of resistor 214 and resistor 215 scales the voltage present at node 108 down to lower voltage based on the ratio of the resistance of resistor 215 to the sum of the resistances of resistor 214 and resistor 215. Thus, the voltage divider formed of resistor 214 and resistor 215 forms output scaling circuit 105.

A gate terminal of p-channel MOSFET 202 is connected to the gate terminal of p-channel MOSFET 203 and to a drain terminal of p-channel MOSFET 203, forming a MOSFET current mirror. The gate terminal and drain terminal of p-channel MOSFET 203 are connected to node 217, which is connected to a collector terminal of NPN bipolar transistor 205. A drain terminal of p-channel MOSFET 202 is connected to node 216, which is connected to a gate terminal of n-channel MOSFET 210 and to a collector terminal of NPN bipolar transistor 204. An emitter terminal of NPN bipolar transistor 204 is connected to ground voltage 110 at node 109. An emitter terminal of NPN bipolar transistor 205 is connected to node 222, which is connected to a first terminal of resistor 206. A second terminal of resistor 206 is connected to ground voltage 110 via node 109. A gate terminal and a drain terminal of p-channel MOSFET 213 are connected to node 220, which is connected to a drain terminal of n-channel MOSFET 210. A source terminal of n-channel MOSFET 210 is connected to node 218, which is connected to a first terminal of resistor 211, to a base terminal of NPN bipolar transistor 205, to a base terminal of NPN bipolar transistor 204, and to a base terminal of NPN bipolar transistor 207. A second terminal of resistor 211 is connected to ground voltage 110 via node 109. An emitter terminal of NPN bipolar transistor 207 is connected to ground voltage 110 via node 109. A collector terminal of NPN bipolar transistor 207 is connected to node 219, which is connected to the drain terminal and gate terminal of p-channel MOSFET 208 and to the gate terminal of p-channel MOSFET 209.

Figure 3:
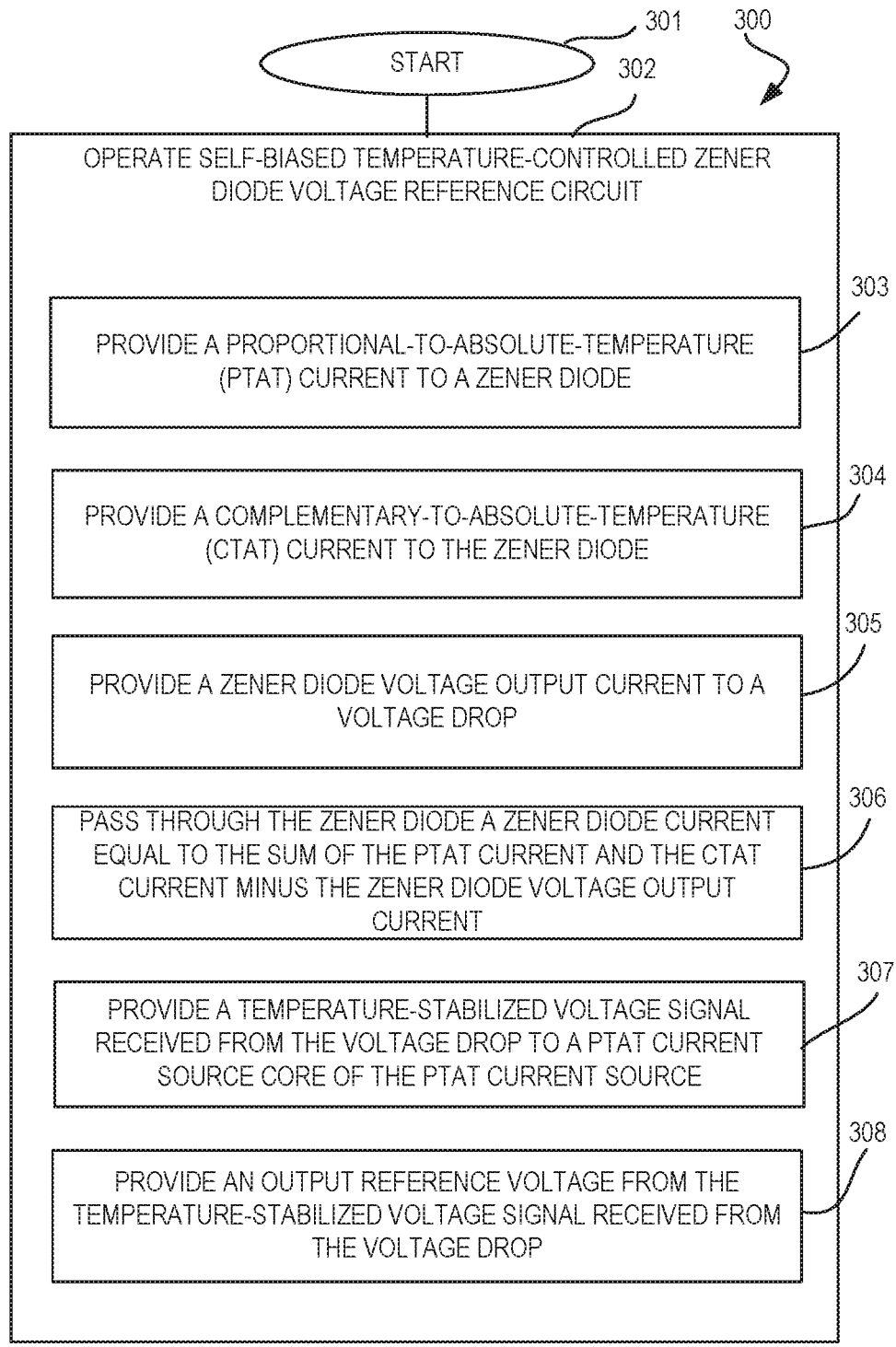
FIG. 3 is a flow diagram illustrating a method for providing an output reference voltage in accordance with at least one embodiment.

FIG. 3 is a flow diagram illustrating a method for providing an output reference voltage in accordance with at least one embodiment. Method 300 begins at block 301 and continues to block 302. Block 302 comprises sub-blocks 303, 304, 305, 306, 307, and 308, which may be performed simultaneously, sequentially in any order, or in a combination of simultaneous and sequential order. Generally, a self-biased temperature-controlled Zener-diode voltage reference circuit is operated in block 302. In sub-block 303, a proportional-to-absolute-temperature (PTAT) current is provided to a Zener diode. In sub-block 304, a complementary-to-absolute-temperature (CTAT) current is provided to the Zener diode. In sub-block 305, a Zener diode voltage output current is provided to a voltage drop. The voltage drop is an electrical circuit block exhibiting a linear voltage difference in relation to a current passing through it. The voltage drop may, as examples, be a resistor or another electrical device (e.g., a transconductance circuit, which may be an active transconductance circuit or a passive transconductance circuit) exhibiting a linear voltage difference for a current passing through it. In sub-block 306, a Zener diode current equal to the sum of the PTAT current and the CTAT current minus the Zener diode voltage output current is passed through the Zener diode. In sub-block 307, a temperature-stabilized voltage signal (e.g., at node 108) received from the voltage drop (e.g., resistor 201) is provided to the PTAT current source core (e.g., at the source terminals of p-channel MOSFETs 202 and 203 of PTAT current source 102). In sub-block 308, an output reference voltage is provided from the temperature-stabilized voltage signal received from the voltage drop. For example, the output reference voltage can be a scaled output reference voltage provided by output scaling circuit 105.

In accordance with at least one embodiment, a temperature-compensated auto-bias circuit to optimize Zener reference voltage performance is disclosed. While Zener reference circuits have previously been biased using an existing current generated in a bandgap circuit trimmed over temperature range, the dependency upon a trimmed bandgap current increased the calibration procedure complexity and ATE test time, resulting in increased cost, and degraded the accuracy of the calibration. Technological improvement is provided by the auto-bias aspect disclosed herein, which is temperature compensated using a combination of a PTAT current source and a CTAT current source, avoiding the trimming and calibration complexity, time, cost, and reduced accuracy of previous technology.

A reference circuit in accordance with at least one embodiment presented herein is auto-biased, and measurement chain accuracy can be evaluated in one shot. This saves test time and removes the former need for analog reference voltage measurements for creating of a look-up table (LUT) of relevant values.

In accordance with at least one embodiment, a core voltage reference, Vz, is generated thanks to a buried Zener. The resulting voltage Vz may vary with temperature, for example, having a positive thermal coefficient (TC) of approximately 1-2 mV/° C. To compensate the Zener voltage variation with the temperature, a PTAT voltage (Proportional To Absolute Temperature voltage) is subtracted from Vz via a voltage drop, which may, for example, be a resistor or another device capable of reducing the voltage by an amount proportional to the current through the device (e.g., having a linear current-to-voltage (I/V) curve). At last, a voltage divider (e.g., a resistor bridge) is used as output scaling circuit 105 to reduce Vz' to obtain a bandgap-compatible output reference voltage (Vout) approximately equal to 1.25V.

The resulting output reference voltage depends on the buried Zener voltage Vz and on the various component value ratios but is otherwise independent. High insensitivity to the package mechanical stresses and long-term stability are provided.

Moreover, in order to have a Zener current biasing that is constant over the temperature, the PTAT current IPTAT pulled down by the PTAT circuit (e.g., resistor 206, NPN bipolar transistors 204 and 205, and p-channel MOSFETs 202 and 203) is reinjected into the Zener via NPN bipolar transistor 207 and p-channel MOSFET transistors 208 and 209, providing better linearity of output reference voltage Vout with temperature.

By providing an auto-biasing Zener reference circuit, at least one embodiment is able to eliminate dependencies on characteristics of an external bias current source. A complementary-to-absolute-temperature (CTAT) current is generated according to operation of resistor 211 and n-channel MOSFET 210, where the CTAT current ICTAT=Vbe/R0, where Vbe is a base-to-emitter voltage (e.g., of NPN bipolar transistor 204 or NPN bipolar transistor 207) and R0 is the resistance of resistor 211.

This CTAT current ICTAT, as well as an additional amount of PTAT current IPTAT, is injected into the node to which the cathode of the Zener diode is attached. ICTAT is injected via n-channel MOSFETs 212 and 213, and IPTAT is injected via n-channel MOSFETs 208 and 209.

The resulting current into the Zener is stable over the temperature range and equal to:

$$Izener = (3*IPTAT + ICTAT) - \left(2*IPTAT + \frac{Vz'}{R}\right) =$$
$$(IPTAT + ICTAT) - ((Vz')/R)$$

where Izener is the Zener diode current, where IPTAT is the PTAT current, where ICTAT is the CTAT current, where Vz' is the temperature-stabilized voltage signal at node 108, and where R is the sum of the resistance values of resistors 214 and 215. FIG. 2 shows current mirror ratios using notations such as "(1x)" and "(3x)" to denote differences in current, which can be obtained, for example, by adjusting the physical dimensions of the respective transistors or portions thereof or, for example, by implementing multiple transistors connected in parallel with each other. The "(1x)" and "(1x)" of p-channel MOSFETs 212 and 213 denote equal currents in the CTAT current mirror comprising p-channel MOSFETs 212 and 213. The "(1x)" and "(1x)" of p-channel MOSFETs 202 and 203 denote equal currents in the PTAT core current mirror comprising p-channel MOSFETs 202 and 203. The "(1x)" and "(3x)," respectively, of p-channel MOSFETs 208 and 209 denote p-channel MOSFET 209 passing three times as much current as p-channel MOSFET 208 in the PTAT current mirror. The tripled current of p-channel MOSFET 208 is reflected in the 3*IPTAT term of the Izener equation shown above. The "(1x)" of each of NPN bipolar transistors 204 and 207 and the "(xN)" of NPN bipolar transistor 205 denote NPN bipolar transistor 205 passing "N" times less current density than NPN bipolar transistors 204 and 207. As an example, NPN bipolar transistor 205 may be implemented using a number N of NPN bipolar transistors of a type similar to NPN bipolar transistors 204 and 207, where N is equal to two or more.

The (IPTAT+ICTAT) portion of the equation is stable with temperature, as temperature changes of IPTAT and ICTAT balance each other out. The (Vz'/(R)) portion of the equation is stable with temperature. The Izener nominal value and temperature coefficient can be adjusted by changing the ratio of the resistance of resistor 206 to the resistance of resistor 211 and the current mirror transistor ratios of p-channel MOSFETs 209 and 208 and p-channel MOSFETs 212 and 213. Accordingly, a reference circuit as disclosed herein allowed avoidance of external bias current source dependency while minimizing additional components and power consumption, thereby providing technological improvement.

In accordance with at least one embodiment, a Zener reference circuit disclosed herein is self-biased and does not require any external current biasing. Such a Zener reference circuit can be applied, for example, to precision measurement circuits where wide operating temperature range and long-term stability is required.

In accordance with at least one embodiment, an apparatus comprises a proportional-to-absolute-temperature (PTAT) current source; a complementary-to-absolute-temperature (CTAT) current source; and a Zener diode. The PTAT current source is coupled to a first Zener diode terminal of the Zener diode, and the CTAT current source coupled to the first Zener diode terminal of the Zener diode. The PTAT current source provides a PTAT current and the CTAT current source providing a CTAT current. The PTAT current and the CTAT current are combined for provide a temperature-compensated bias current.

In accordance with at least one embodiment, the apparatus further comprises a voltage drop having a first voltage drop terminal coupled to the first Zener diode terminal and a second voltage drop terminal coupled to a temperature-stabilized supply voltage input terminal of the PTAT current source. In accordance with at least one embodiment, the apparatus further comprises an output scaling circuit having a first output scaling circuit terminal coupled to the second voltage drop terminal, the output scaling circuit providing an output reference voltage. In accordance with at least one embodiment, the voltage drop is a resistor. In accordance with at least one embodiment, a voltage output of the PTAT current source is coupled to a CTAT current source control terminal of the CTAT current source. In accordance with at least one embodiment, the CTAT current source comprises a first transistor having a first terminal coupled to the CTAT current source control terminal, a second terminal coupled to a CTAT current source resistor, and a third terminal coupled to a CTAT current source current mirror. In accordance with at least one embodiment, the third terminal is further coupled to a first PTAT transistor base terminal of a first PTAT transistor, to a second PTAT transistor base terminal of a second PTAT transistor, and to a third PTAT transistor base terminal of a third PTAT transistor.

In accordance with at least one embodiment, a method comprises providing a proportional-to-absolute-temperature (PTAT) current to a Zener diode; providing a complementary-to-absolute-temperature (CTAT) current to the Zener diode; providing a Zener diode voltage output current to a voltage drop; and passing through the Zener diode a Zener diode current equal to the sum of the PTAT current and the CTAT current minus the Zener diode voltage output current. In accordance with at least one embodiment, the method further comprises providing a temperature-stabilized voltage signal received from the voltage drop to the PTAT current source. In accordance with at least one embodiment, the method further comprises providing an output reference voltage from the temperature-stabilized voltage signal received from the voltage drop. In accordance with at least one embodiment, the output reference voltage is a scaled output reference voltage. In accordance with at least one embodiment, providing the temperature-stabilized voltage signal received from the voltage drop to the PTAT current source further comprises providing the temperature-stabilized voltage signal to a PTAT current source core of the PTAT current source. In accordance with at least one embodiment, the voltage drop is a resistor. In accordance with at least one embodiment, the method further comprises controlling the CTAT current according to a CTAT current control signal obtained based on the temperature-stabilized voltage signal.

In accordance with at least one embodiment, an integrated circuit comprises a proportional-to-absolute-temperature (PTAT) current source; a complementary-to-absolute-temperature (CTAT) current source; and a Zener diode. The PTAT current source is coupled to the Zener diode. The CTAT current source is coupled to the Zener diode. The PTAT current source comprises a first PTAT transistor and a PTAT current source resistor coupled, at a first PTAT current source resistor terminal, to a first PTAT transistor emitter terminal of the first PTAT transistor and, at a second PTAT current source resistor terminal, to a ground voltage. The CTAT current source comprises a CTAT current source resistor coupled, at a first CTAT current source resistor terminal, to a first PTAT transistor base terminal of the first PTAT transistor and, at a second CTAT current source resistor terminal, to the ground voltage. The PTAT current source provides a PTAT current based on a PTAT current source resistor resistance of the PTAT current source resistor. The CTAT current source provides a CTAT current based on a CTAT current source resistor resistance of the CTAT current source resistor. At least a portion of a combination of the PTAT current and the CTAT current bias the Zener diode.

In accordance with at least one embodiment, the integrated circuit further comprises a voltage drop comprising a resistor having a first voltage drop terminal coupled to the first Zener diode terminal and a second voltage drop terminal coupled to a temperature-stabilized supply voltage input of the PTAT current source. In accordance with at least one embodiment, the integrated circuit further comprises an output scaling circuit having a first output scaling circuit terminal coupled to the second voltage drop terminal, the output scaling circuit providing an output reference voltage. In accordance with at least one embodiment, a voltage output of the PTAT current source is coupled to a CTAT current source terminal of the CTAT current source. In accordance with at least one embodiment, the CTAT current source comprises a first transistor having a first terminal coupled to the CTAT current source control terminal, a second terminal coupled to the CTAT current source resistor, and a third terminal coupled to a CTAT current source current mirror. In accordance with at least one embodiment, the third terminal is further coupled to the first PTAT transistor base terminal of the first PTAT transistor, to a second PTAT transistor base terminal of a second PTAT transistor, and to a third PTAT transistor base terminal of a third PTAT transistor.

The concepts of the present disclosure have been described above with reference to specific embodiments. However, one of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. Apparatus comprising:
   a proportional-to-absolute-temperature (PTAT) current source;
   a complementary-to-absolute-temperature (CTAT) current source;
   a Zener diode, the PTAT current source coupled to a first Zener diode terminal of the Zener diode, and the CTAT current source coupled to the first Zener diode terminal of the Zener diode, the PTAT current source providing a PTAT current and the CTAT current source providing a CTAT current, wherein the PTAT current and the CTAT current are combined for provide a temperature-compensated bias current, and a voltage output of the PTAT current source is coupled to a CTAT current source control terminal of the CTAT current source.

2. The apparatus of claim 1 further comprising:
   a voltage drop having a first voltage drop terminal coupled to the first Zener diode terminal and a second voltage drop terminal coupled to a temperature-stabilized supply voltage input terminal of the PTAT current source.

3. The apparatus of claim 2 further comprising:
   an output scaling circuit having a first output scaling circuit terminal coupled to the second voltage drop terminal, the output scaling circuit providing an output reference voltage.

4. The apparatus of claim 2 wherein the voltage drop is a resistor.

5. The apparatus of claim 1 wherein the CTAT current source comprises a first transistor having a first terminal coupled to the CTAT current source control terminal, a second terminal coupled to a CTAT current source resistor, and a third terminal coupled to a CTAT current source current mirror.

6. The apparatus of claim 5 wherein the third terminal is further coupled to a first PTAT transistor base terminal of a first PTAT transistor, to a second PTAT transistor base terminal of a second PTAT transistor, and to a third PTAT transistor base terminal of a third PTAT transistor.

7. A method comprising:
providing a proportional-to-absolute-temperature (PTAT) current to a Zener diode;
providing a complementary-to-absolute-temperature (CTAT) current to the Zener diode;
providing a Zener diode voltage output current to a voltage drop; and
passing through the Zener diode a Zener diode current equal to the sum of the PTAT current and the CTAT current minus the Zener diode voltage output current, wherein a voltage output of a PTAT current source providing the PTAT current is coupled to a CTAT current source control terminal of a CTAT current source providing the CTAT current.

8. The method of claim 7 further comprising:
providing a temperature-stabilized voltage signal received from the voltage drop to the PTAT current source.

9. The method of claim 8 further comprising:
providing an output reference voltage from the temperature-stabilized voltage signal received from the voltage drop.

10. The method of claim 9 wherein the output reference voltage is a scaled output reference voltage.

11. The method of claim 8 wherein providing the temperature-stabilized voltage signal received from the voltage drop to the PTAT current source further comprises:
providing the temperature-stabilized voltage signal to a PTAT current source core of the PTAT current source.

12. The method of claim 7 wherein the voltage drop is a resistor.

13. The method of claim 8 further comprising:
controlling the CTAT current according to a CTAT current control signal obtained based on the temperature-stabilized voltage signal.

14. An integrated circuit comprising:
a proportional-to-absolute-temperature (PTAT) current source;
a complementary-to-absolute-temperature (CTAT) current source;
a Zener diode, wherein the PTAT current source is coupled to the Zener diode, wherein the CTAT current source is coupled to the Zener diode, wherein the PTAT current source comprises a first PTAT transistor and a PTAT current source resistor coupled, at a first PTAT current source resistor terminal, to a first PTAT transistor emitter terminal of the first PTAT transistor and, at a second PTAT current source resistor terminal, to a ground voltage, wherein the CTAT current source comprises a CTAT current source resistor coupled, at a first CTAT current source resistor terminal, to a first PTAT transistor base terminal of the first PTAT transistor and, at a second CTAT current source resistor terminal, to the ground voltage, wherein PTAT current source provides a PTAT current based on a PTAT current source resistor resistance of the PTAT current source resistor, and the CTAT current source provides a CTAT current based on a CTAT current source resistor resistance of the CTAT current source resistor, wherein at least a portion of a combination of the PTAT current and the CTAT current bias the Zener diode.

15. The integrated circuit of claim 14 further comprising:
a voltage drop comprising a resistor having a first voltage drop terminal coupled to the first Zener diode terminal and a second voltage drop terminal coupled to a temperature-stabilized supply voltage input of the PTAT current source.

16. The integrated circuit of claim 15 further comprising:
an output scaling circuit having a first output scaling circuit terminal coupled to the second voltage drop terminal, the output scaling circuit providing an output reference voltage.

17. The integrated circuit of claim 14 wherein a voltage output of the PTAT current source is coupled to a CTAT current source terminal of the CTAT current source.

18. The integrated circuit of claim 17 wherein the CTAT current source comprises a first transistor having a first terminal coupled to the CTAT current source control terminal, a second terminal coupled to the CTAT current source resistor, and a third terminal coupled to a CTAT current source current mirror.

19. The integrated circuit of claim 18 wherein the third terminal is further coupled to the first PTAT transistor base terminal of the first PTAT transistor, to a second PTAT transistor base terminal of a second PTAT transistor, and to a third PTAT transistor base terminal of a third PTAT transistor.

* * * * *